(12) United States Patent
Lee et al.

(10) Patent No.: US 12,354,654 B2
(45) Date of Patent: Jul. 8, 2025

(54) MEMORY DEVICE COMPRISING BIOCOMPATIBLE POLYMER NANOPARTICLES, AND MANUFACTURING METHOD THEREFOR

(71) Applicant: CJ CHEILJEDANG CORPORATION, Seoul (KR)

(72) Inventors: Hyun Ho Lee, Seoul (KR); Won Kyu Kang, Gyeonggi-do (KR); Hun Sang Jung, Gyeonggi-do (KR)

(73) Assignee: CJ CHEILJEDANG CORPORATION, Seoul (KR)

( * ) Notice: Subject to any disclaimer, the term of this patent is extended or adjusted under 35 U.S.C. 154(b) by 1051 days.

(21) Appl. No.: 17/282,954

(22) PCT Filed: Oct. 4, 2019

(86) PCT No.: PCT/KR2019/013007
§ 371 (c)(1),
(2) Date: Oct. 5, 2021

(87) PCT Pub. No.: WO2020/071837
PCT Pub. Date: Apr. 9, 2020

(65) Prior Publication Data
US 2022/0020429 A1    Jan. 20, 2022

(30) Foreign Application Priority Data

Oct. 5, 2018    (KR) .................. 10-2018-0118827

(51) Int. Cl.
*G11C 13/00*    (2006.01)
*B82Y 10/00*    (2011.01)
(Continued)

(52) U.S. Cl.
CPC .......... *G11C 13/0019* (2013.01); *C08L 79/02* (2013.01); *H10K 10/00* (2023.02);
(Continued)

(58) Field of Classification Search
CPC .... H10K 71/00; H10K 10/701; H10K 10/478; G11C 13/0019
See application file for complete search history.

(56) References Cited

U.S. PATENT DOCUMENTS 6,617,609 B2    9/2003    Kelley et al.
7,348,653 B2    3/2008    Cho et al.
(Continued)

FOREIGN PATENT DOCUMENTS

CN    1582505 A    2/2005
CN    106033794 A    10/2016
(Continued)

OTHER PUBLICATIONS

Notice of Allowance issued on Feb. 6, 2023 for corresponding Japanese patent application No. 2021-518756 (3 pages).
(Continued)

*Primary Examiner* — Raj R Gupta
(74) *Attorney, Agent, or Firm* — Merchant & Gould P.C.

(57) ABSTRACT

The present invention relates to a memory device comprising biocompatible polymer nanoparticles, and a manufacturing method therefor. The present invention can provide a memory device which can be more efficiently integrated in the organic semiconductor field when applied to a biocompatible electronic device, and can have excellent capacitance by being treated with a silane coupling agent. In addition, the method for manufacturing the memory device, according to the present invention, uses a solution process, and thus a memory device can be manufactured with a very simple method.

9 Claims, 4 Drawing Sheets

(51) Int. Cl.
  *C08L 79/02* (2006.01)
  *H10K 10/00* (2023.01)
  *H10K 10/46* (2023.01)
  *H10K 71/00* (2023.01)
(52) U.S. Cl.
  CPC ......... *H10K 10/478* (2023.02); *H10K 10/701* (2023.02); *H10K 71/00* (2023.02); *B82Y 10/00* (2013.01); *C08L 2201/06* (2013.01)

(56) References Cited

U.S. PATENT DOCUMENTS

| | | | |
|---|---|---|---|
| 7,539,038 | B2 | 5/2009 | Lee et al. |
| 8,089,115 | B2 | 1/2012 | Leong et al. |
| 11,001,840 | B2 | 5/2021 | Li et al. |
| 2003/0102472 | A1 | 6/2003 | Kelley et al. |
| 2006/0020824 | A1 | 1/2006 | Matthews et al. |
| 2006/0081835 | A1* | 4/2006 | Hutchison ............. B82Y 10/00 257/17 |
| 2007/0029546 | A1 | 2/2007 | Cho et al. |
| 2009/0146202 | A1 | 6/2009 | Leong et al. |
| 2015/0037259 | A1* | 2/2015 | Chiu .................... H10K 85/151 435/5 |
| 2015/0179820 | A1 | 6/2015 | Kim |
| 2016/0009552 | A1 | 1/2016 | Ressier et al. |
| 2016/0046936 | A1 | 2/2016 | Li et al. |
| 2021/0230595 | A1 | 7/2021 | Li et al. |

FOREIGN PATENT DOCUMENTS

| | | | |
|---|---|---|---|
| CN | 106169536 A | 11/2016 | |
| CN | 106449977 A | 2/2017 | |
| CN | 106953010 A | 7/2017 | |
| JP | 2006-303493 A | 11/2006 | |
| JP | 2016-513090 A | 5/2016 | |
| KR | 10-2006-0100581 A | 9/2006 | |
| KR | 10-2012-0021432 A | 3/2012 | |
| KR | 10-2012-0059865 A | 6/2012 | |
| KR | 10-2013-0104820 A | 9/2013 | |
| KR | 10-1377053 B1 | 3/2014 | |
| KR | 1377053 B1 * | 3/2014 | .......... G01N 27/414 |
| KR | 10-2015-0108580 A | 9/2015 | |
| KR | 10-2016-0048444 A | 5/2016 | |
| WO | 2007-136350 A1 | 11/2007 | |
| WO | 2015141988 A1 | 9/2015 | |

OTHER PUBLICATIONS

Office Action issued on May 30, 2023 for the corresponding Chinese patent application No. 201980079457.7 (8 pages).

Yo-Han Kim et al., "Organic memory device with polyaniline nanoparticles embedded as charging elements", Applied Physics Letters, vol. 100, No. 16, Apr. 17, 2012, p. 163301.

Chien-Chung Shih et al., "Conjugated Polymer Nanoparticles as Nano Floating Gate Electrets for High Performance Nonvolatile Organic Transistor Memory Devices", Advanced Functional Materials, vol. 25, No. 10, Jan. 26, 2015, pp. 1-9.

International Search Report issued in corresponding International Patent Application No. PCT/KR2019/013007, mailed Jan. 17, 2020, 4 pages.

Office Action issued on Aug. 1, 2022 for corresponding Japanese patent application No. 2021-518756 (3 pages).

* cited by examiner

[Fig.1]
100
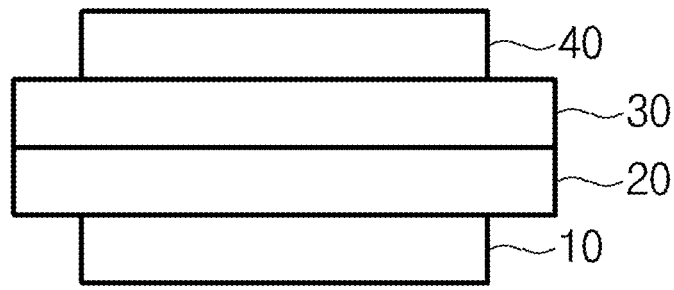
[Fig.2]
10
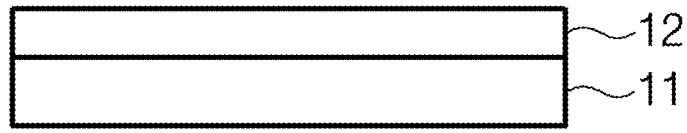

20
[Fig.3]

[Fig.4]
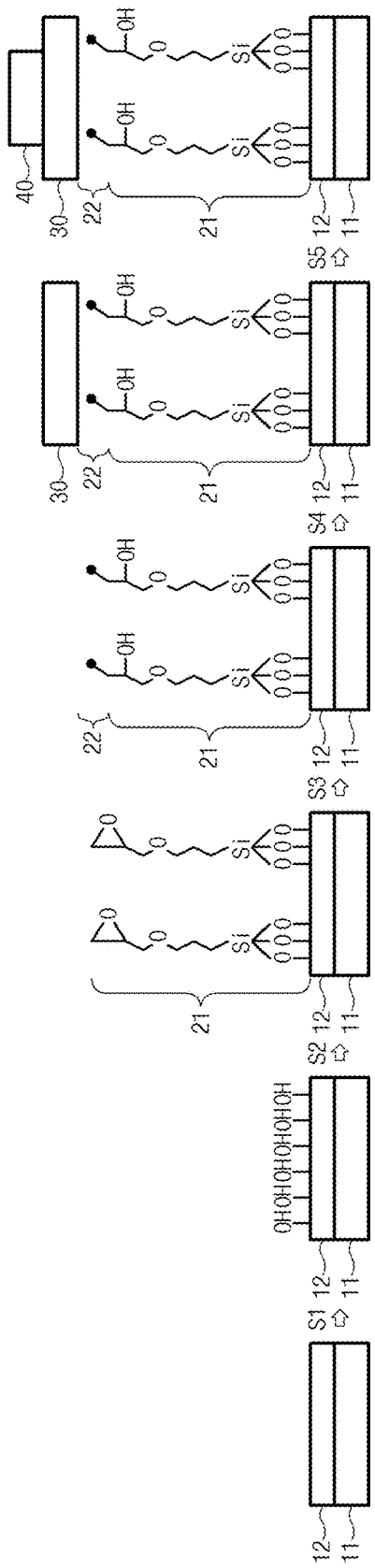

[Fig.5]
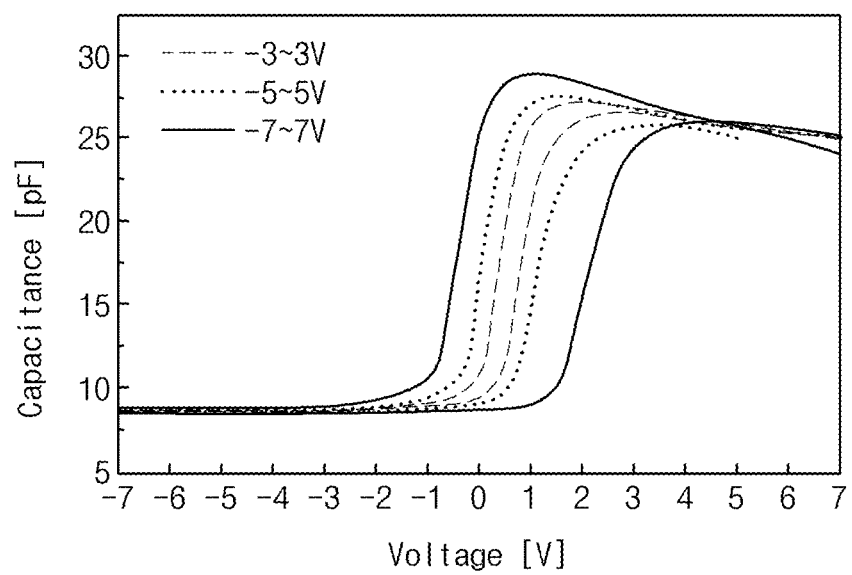

MEMORY DEVICE COMPRISING BIOCOMPATIBLE POLYMER NANOPARTICLES, AND MANUFACTURING METHOD THEREFOR

This application is a National Stage Application of PCT/KR2019/013007, filed 4 Oct. 2019, which claims benefit of Serial No. 10-2018-0118827, filed 5 Oct. 2018 in Republic of Korea, and which applications are incorporated herein by reference. To the extent appropriate, a claim of priority is made to each of the above disclosed applications.

TECHNICAL FIELD

The present invention relates to a memory device including nanoparticles of a biodegradable polymer and a manufacturing method thereof.

BACKGROUND ART

In recent years, research and development on a method of manufacturing a memory device using biomaterials has been conducted, and in particular, a charge/discharge layer has been actively researched to enhance the capacitance of the memory device.

Conventionally, a layer of charging/discharging electric charge has been researched using metal nanoparticles, but there is a lack of research on a memory device made of a biocompatible material.

In addition, a metal deposition process is carried out by physical deposition, such as vacuum thermal deposition and sputtering, chemical deposition, which is difficult and complex and requires additional processes, such that expensive equipment is required.

Therefore, there is an urgent need to research and develop a memory device made of a biocompatible material which is efficiently applicable to an electronic device by solving the above-mentioned problem and also enhancing capacitance.

PRIOR-ART DOCUMENTS (Patent Document 1) Korean Patent Publication No. 2013-0104820

DISCLOSURE

Technical Problem

The present invention is directed to providing a memory device including biodegradable polymer nanoparticles, which is applicable to a biocompatible electronic device.

The present invention is also directed to providing a method of manufacturing a memory device including biodegradable polymer nanoparticles by a simple solution process rather than a conventional complex process.

Technical Solution

One aspect of the present invention provides a memory device which includes: a silicon layer including silica ($SiO_2$); a charge/discharge layer; an organic semiconductor layer; and an electrode layer, wherein the charge/discharge layer has a structure in which biodegradable polymer nanoparticles are dispersed in a silane matrix.

Another aspect of the present invention provides a biocompatible electronic device including the above-described memory device.

Still another aspect of the present invention provides a method of manufacturing a memory device, which includes the steps of: forming a charge/discharge layer, in which biodegradable polymer nanoparticles are dispersed in a silane matrix, on a silicon layer including silica (Sift); and forming an organic semiconductor layer and an electrode layer on the charge/discharge layer.

Advantageous Effects

The memory device according to the present invention can be more efficiently integrated in the field of semiconductors when applied to a biocompatible electronic device, and can have excellent capacitance by including a silane matrix formed by treatment with a silane coupling agent.

In addition, the method of manufacturing a memory device according to the present invention uses a solution process, such that a memory device can be manufactured by a very simple method.

DESCRIPTION OF DRAWINGS

FIG. 1 is a diagram of a memory device of the present invention.

FIG. 2 is a diagram of a silicon layer including silica which is one of the components constituting a memory device of the present invention.

FIG. 3 is a diagram of a charge/discharge layer which is one of the components constituting a memory device of the present invention.

FIG. 4 is a diagram of a method of manufacturing a memory device according to an embodiment of the present invention.

FIG. 5 illustrates the result of measuring the capacitance-voltage (hereinafter, simply referred to as "C-V") of a memory device according to the example.

LIST OF REFERENCE NUMERALS

100: memory device
10: silicon layer including silica ($SiO_2$), 11: silicon substrate, 12: silica layer
20: charge/discharge layer, 21: silane matrix, 22: biodegradable polymer nanoparticles
30: organic semiconductor layer
40: electrode layer

MODES OF THE INVENTION

The present invention may be subjected to many changes and modifications and have several forms. Therefore, it should be understood that specific embodiments of the present invention are illustrated in the drawings and described in detail in the detailed description.

However, it should be understood that the present invention is not intended to be limited to the specific forms set forth herein, and is intended to encompass all types of modifications, equivalents, and substitutions included in the technical scope and spirit of the present invention.

It will be further understood that the terms "comprises," "comprising," "includes," "including," "has" and/or "having," when used herein, specify the presence of stated features, integers, steps, operations, elements, components and/or groups thereof, but do not preclude the presence or addition of one or more other features, integers, steps, operations, elements, components and/or groups thereof.

Also, drawings attached to the present invention should be understood as being enlarged or reduced for the sake of convenience of the description.

Hereinafter, the present invention will be described in detail.

Memory Device

FIG. 1 is a diagram of a memory device of the present invention. Referring to FIG. 1, a memory device 100 of the present invention includes a silicon layer 10 including silica ($SiO_2$); a charge/discharge layer 20, an organic semiconductor layer 30, and an electrode layer 40.

FIG. 2 is a diagram of the silicon layer including silica which is one of the components constituting the memory device of the present invention. Referring to FIG. 2, the silicon layer 10 including silica includes a silicon substrate 11 and a silica layer 12 deposited on the silicon substrate 11.

In this case, although not particularly limited thereto, the silicon substrate 11 may be a p-type silicon substrate.

The silica layer 12 may have an average thickness of 300 nm or less, specifically, 5 to 300 nm, 10 to 100 nm, or 10 to 30 nm.

The deposition of the silica layer 12 on the silicon substrate 11 allows the silicon layer 10 to be functionalized with a hydroxyl group, and the functionalization with a hydroxyl group through treatment with UV-ozone or a base allows the silicon layer 10 to be bonded with a silane coupling agent.

FIG. 3 is a diagram of the charge/discharge layer which is one of the components constituting the memory device of the present invention. Referring to FIG. 3, the charge/discharge layer 20 has a structure in which biodegradable polymer nanoparticles 22 are dispersed in a silane matrix 21. In the specification, the term "charge" means increasing the amount of stored electric charge by allowing an electric current to enter a storage battery or a secondary battery from the outside, the term "discharge", as opposed to charge, means reducing the amount of stored electric charge by discharging an electric current from a storage battery or a secondary battery, and the term "charge/discharge layer" means a layer having electric charge that can be charged/discharged.

The silane matrix 21 may have an average thickness of 5 nm or less, specifically, 0.1 to 5 nm.

The silane matrix 21 includes a silane coupling agent. Specifically, although not particularly limited thereto, the silane coupling agent may be (3-glycidyloxypropyl) trimethoxysilane (hereinafter, simply referred to as "GPTMS").

When the memory device 100 of the present invention includes the silane matrix 21, a memory effect can be increased when a higher voltage is applied, and the stability of the memory device can be ensured.

In the specification, the term "biodegradable polymer" means a polymer which is converted into a low-molecular-weight compound by the metabolism of organisms involved in at least one decomposition process, the term "nanoparticle" means a particle having at least one dimension of 100 nm, that is, less than one ten-millionth meter, and the term "biodegradable polymer nanoparticle" means a particle that has a diameter of 100 nm or less and is composed of a polymer which is converted into a low-molecular-weight compound by the metabolism.

Specifically, the biodegradable polymer nanoparticles 22, which are formed by the reaction between the epoxy group of the silane coupling agent and the amine group included in the biodegradable polymer, are dispersed in the silane matrix, wherein the biodegradable polymer nanoparticles 22 may have an average diameter of 50 nm or less, specifically, 1 to 50 nm. An average diameter of biodegradable polymer nanoparticles 22 can be measured by a laser diffraction method as known a conventional method.

When the memory device 100 of the present invention includes the biodegradable polymer nanoparticles 22, the memory device 100 can be applied to a biocompatible electronic device.

The biodegradable polymer is not particularly limited as long as it includes an amino acid having one or more amine groups, and may specifically be any one of poly-L-arginine, polyhistidine, polytryptophan, and poly-L-lysine. In the specification, the term "poly-L-arginine" refers to a positively charged synthetic polyamino acid having one HCl per arginine unit.

In the specification, the term "organic semiconductor" refers to a semiconductor made of a carbon material. Most organic compounds are insulators, and organic semiconductors refer generally to extrinsic semiconductors which are organic material crystals obtained when a molecular compound is prepared by incorporating a material that easily donates electrons upon electrolytic dissociation and a material that easily accepts electrons.

The organic semiconductor layer 30 is not particularly limited as long as it is applicable to the memory device. Specifically, the organic semiconductor layer may include one or more of pentacene, poly(3,4-ethylenedioxythiophene), poly(thienylene vinylene), and an oligothiophene, particularly, pentacene consisting of 22 π-bonds.

The organic semiconductor layer 30 may have an average thickness of 100 nm or less, particularly, 10 to 100 nm. Specifically, the organic semiconductor layer 30 may have an average thickness of 10 to 50 nm.

The electrode layer 40 is not particularly limited as long as it is applicable to the memory device and may specifically be a gold (Au) electrode layer. In this case, the Au electrode layer may include an Au dot having an average diameter of 100 to 500 μm and may have an average thickness of 10 to 200 nm.

Biocompatible Electronic Device

Another aspect of the present invention provides a biocompatible electronic device including the above-described memory device.

The structures and components of the biocompatible electronic device are well known to those skilled in the art, so detailed description thereof will be omitted herein.

The contents of structures and components of the biocompatible electronic device which are known to those skilled in the art are incorporated in the contents of the present invention.

Method of Manufacturing Memory Device

Still another aspect of the present invention provides a method of manufacturing a memory device, which includes the steps of: forming a charge/discharge layer, in which biodegradable polymer nanoparticles are dispersed in a silane matrix, on a silicon layer including silica ($SiO_2$); and forming an organic semiconductor layer and an electrode layer on the charge/discharge layer.

Specifically, FIG. 4 is a diagram of the method of manufacturing a memory device according to an embodiment of the present invention. Referring to FIG. 4, a silicon substrate 11 on which a silica ($SiO_2$) layer 12 has been deposited is treated with UV-ozone or a base to functionalize the surface of the silica layer with a hydroxyl group (—OH) (process S1). In this case, the silicon substrate 11 may be a p-type silicon substrate, and the silica layer 12 may have a thickness of 10 to 300 nm, specifically 300 nm or less, and more specifically 5 to 300 nm, 10 to 100 nm, or 10 to 30 nm. Although not particularly limited thereto, the base used to functionalize the surface of the silica layer 12 with a hydroxyl group is preferably sodium hydroxide (NaOH).

The silicon layer 10 having been functionalized with a hydroxyl group is treated with a silane coupling agent, such that the hydroxyl group and the silane coupling agent are bonded to form a silane matrix 21 (process S2). In this case, although not particularly limited thereto, the silane coupling agent may be GPTMS. The silane matrix 21 may have an average thickness of 5 nm or less, specifically, 0.1 to 5 nm. When the memory device 100 of the present invention includes the silane matrix 21, a memory effect can be increased when a higher voltage is applied, and the stability of the memory device can be ensured.

Subsequently, the epoxy group included in the silane matrix 21 reacts with the amine group included in a biodegradable polymer so as to disperse biodegradable polymer nanoparticles 22 on the silane matrix 21, wherein the biodegradable polymer nanoparticles are prepared by a solution process (process S3). In this case, the biodegradable polymer may be poly-L-arginine, and the biodegradable polymer nanoparticles 22 may have an average diameter of 50 nm or less, specifically, 1 to 50 nm. When the memory device 100 of the present invention includes the biodegradable polymer nanoparticles 22, the memory device 100 can be applied to a biocompatible electronic device.

Afterward, an organic semiconductor layer 30 and an electrode layer 40 are formed while depositing them on the biodegradable polymer nanoparticles 22 via thermal evaporation (processes S4 and S5). In this case, the organic semiconductor layer 30 is not particularly limited as long as it is applicable to the memory device and may specifically include one or more of pentacene, poly(3,4-ethylenedioxythiophene), poly(thienylene vinylene), and an oligothiophene, particularly, pentacene consisting of 22 π-bonds.

The organic semiconductor layer 30 may have an average thickness of 100 nm or less, preferably, 10 to 100 nm. Specifically, the organic semiconductor layer 30 may have an average thickness of 10 to 50 nm.

The electrode layer 40 is not particularly limited as long as it is applicable to the memory device and may specifically be a gold (Au) electrode layer. In this case, the Au electrode layer may include an Au dot having an average diameter of 100 to 500 μm and may have an average thickness of 10 to 200 nm.

Hereinafter, the memory device including biodegradable polymer nanoparticles and the manufacturing method thereof according to the present invention will be described in more detail according to an example and an experimental example.

However, it should be understood that the following example and experimental example proposed herein are given for the purpose of illustrating the memory device including biodegradable polymer nanoparticles and the manufacturing method thereof according to the present invention only and are not intended to limit the scope of the present invention.

Example. Manufacture of Memory Device

The surface of a p-type silicon substrate (size: 1.5 cm×3.0 cm, thickness: 0.6 T), on which a 10 nm-thick silica layer (SiO$_2$) had been deposited, was treated with UV-ozone to allow the surface of the silica layer to be functionalized with a hydroxyl group.

Subsequently, the resulting silicon layer was impregnated with a GPTMS solution (5% in ethanol), such that the hydroxyl group and the GPTMS reacted to form a silane matrix (thickness of the silane matrix: about 0.1 to 5 nm).

To disperse poly-L-arginine (Mw: 1700 Da) on the surface of the silane matrix, dip coating was gently performed for an hour. Poly-L-arginine was added so that a final concentration was 2 mg/ml (1 mM), and dip coating was then performed for an hour to form poly-L-arginine nanoparticles (diameter: 1 to 50 nm) on the GPTMS layer (solution process).

Subsequently, a pentacene semiconductor layer (thickness: 50 to 80 nm) and an Au electrode (diameter of Au dot: 500 μm, thickness of Au electrode: 150 to 200 nm) were deposited via thermal evaporation to manufacture a memory device.

Experimental Example 1. Analysis of C-V Characteristics

The C-V performance of the memory device according to the example was measured at a frequency of 1 MHz using HP Agilent 4284A, and a result thereof is shown in FIG. 5.

Specifically, a change in capacitance was confirmed while applying voltage to the Au electrode, assuming that silicon wafer was a ground. In this case, capacitance was checked while sweeping ±3 V, ±5 V, and ±7 V voltages by increasing voltages by ±2 V from 3 V and −3 V.

As a result, it can be seen that a particular sweep hysteresis was formed. As a higher voltage was applied, the memory effect is increased.

The invention claimed is:
1. A memory device comprising:
   a silicon layer including silica (SiO$_2$);
   a charge/discharge layer;
   an organic semiconductor layer; and
   an electrode layer,
   wherein the charge/discharge layer has a structure in which nanoparticles of a biodegradable polymer are dispersed in a silane matrix;
   wherein the biodegradable polymer comprises poly-amino acids;
   wherein an amino acid of the poly-amino acids has one or more amine groups; and
   wherein the nanoparticles of a biodegradable polymer are dispersed in a silane matrix by the reaction between the epoxy group of the silane coupling agent and the amine group of the poly-amino acids.
2. The memory device of claim 1, wherein the silane matrix has an average thickness of 5 nm or less.
3. The memory device of claim 1, wherein the silane matrix includes (3-glycidyloxypropyl) trimethoxysilane.
4. The memory device of claim 1, wherein the nanoparticles of a biodegradable polymer have an average diameter of 50 nm or less.
5. The memory device of claim 1, wherein the biodegradable polymer is any one of poly-L-arginine, polyhistidine, polytryptophan, and poly-L-lysine.
6. The memory device of claim 1, wherein the organic semiconductor layer includes one or more of pentacene, poly(3,4-ethylenedioxythiophene), poly(thienylene vinylene), and an oligothiophene.
7. A biocompatible electronic device comprising the memory device of claim 1.
8. A method of manufacturing a memory device, comprising:

a step of forming a charge/discharge layer, in which biodegradable polymer nanoparticles are dispersed in a silane matrix, on a silicon layer including silica ($SiO_2$); and a step of forming an organic semiconductor layer and an electrode layer on the charge/discharge layer;

wherein the biodegradable polymer comprises poly-amino acids;

wherein an amino acid of the poly-amino acids has one or more amine groups; and wherein the nanoparticles of a biodegradable polymer are dispersed in a silane matrix by the reaction between the epoxy group of the silane coupling agent and the amine group of the poly-amino acids.

9. The method of claim 8, wherein the step of forming a charge/discharge layer, in which biodegradable polymer nanoparticles are dispersed in a silane matrix, on a silicon layer including silica ($SiO_2$) includes:

functionalizing a silicon layer including silica ($SiO_2$) by treating with UV-ozone or a base for bonding with a silane coupling agent; and applying a biodegradable polymer nanoparticle solution to the silane matrix.

* * * * *